(12) United States Patent
Nakamura et al.

(10) Patent No.: US 10,559,627 B2
(45) Date of Patent: Feb. 11, 2020

(54) MEMORY DEVICE AND RECTIFIER

(71) Applicant: Toshiba Memory Corporation, Minato-ku (JP)

(72) Inventors: Kenji Nakamura, Kawasaki (JP); Hideyuki Nishizawa, Toshima (JP)

(73) Assignee: Toshiba Memory Corporation, Minato-ku (JP)

( * ) Notice: Subject to any disclaimer, the term of this patent is extended or adjusted under 35 U.S.C. 154(b) by 221 days.

(21) Appl. No.: 15/707,042

(22) Filed: Sep. 18, 2017

(65) Prior Publication Data

US 2018/0277603 A1 Sep. 27, 2018

(30) Foreign Application Priority Data

Mar. 22, 2017 (JP) .................. 2017-056697

(51) Int. Cl.
*H01L 27/28* (2006.01)
*H01L 51/05* (2006.01)
(Continued)

(52) U.S. Cl.
CPC .......... *H01L 27/285* (2013.01); *G11C 13/003* (2013.01); *G11C 13/0007* (2013.01);
(Continued)

(58) Field of Classification Search
None
See application file for complete search history.

(56) References Cited

U.S. PATENT DOCUMENTS

| 5,105,233 A | 4/1992 | Egusa |
| 8,809,846 B2 * | 8/2014 | Tada .................. G11C 13/0014 257/40 |

(Continued)

FOREIGN PATENT DOCUMENTS

| JP | 3-262170 | 11/1991 |
| JP | 6-302807 | 10/1994 |

(Continued)

OTHER PUBLICATIONS

Robert M. Metzger "Six Unimolecular Rectifiers and What Lies Ahead", Introducing Molecular Electronics,Lecture Notes in Physics, vol. 680, 24 pages.

(Continued)

*Primary Examiner* — Kevin M Bernatz
(74) *Attorney, Agent, or Firm* — Oblon, McClelland, Maier & Neustadt, L.L.P.

(57) ABSTRACT

A memory device according to an embodiment includes a first conductive layer, a second conductive layer, a variable resistance layer disposed between the first conductive layer and the second conductive layer, and an organic molecular layer disposed between the variable resistance layer and the second conductive layer and containing organic molecules. Each of the organic molecules includes a first fused polycyclic unit having a first HOMO level, a second fused polycyclic unit having a second HOMO level higher in energy than the first HOMO level, and a third fused polycyclic unit disposed between the first fused polycyclic unit and the second fused polycyclic unit. The third fused polycyclic unit has a third HOMO level higher in energy than the first HOMO level and the second HOMO level.

20 Claims, 10 Drawing Sheets

(51) Int. Cl.
*G11C 13/00* (2006.01)
*H01L 45/00* (2006.01)
*H01L 27/24* (2006.01)
*H01L 51/00* (2006.01)

(52) U.S. Cl.
CPC ...... *G11C 13/0014* (2013.01); *G11C 13/0016* (2013.01); *G11C 13/0026* (2013.01); *G11C 13/0097* (2013.01); *H01L 27/249* (2013.01); *H01L 27/2409* (2013.01); *H01L 45/04* (2013.01); *H01L 45/1226* (2013.01); *H01L 45/1233* (2013.01); *H01L 45/146* (2013.01); *H01L 51/0591* (2013.01); *G11C 13/004* (2013.01); *G11C 13/0069* (2013.01); *G11C 2013/0045* (2013.01); *G11C 2013/0073* (2013.01); *G11C 2013/0078* (2013.01); *G11C 2213/32* (2013.01); *G11C 2213/52* (2013.01); *G11C 2213/71* (2013.01); *G11C 2213/72* (2013.01); *G11C 2213/73* (2013.01); *H01L 45/1253* (2013.01); *H01L 51/0058* (2013.01)

(56) References Cited

U.S. PATENT DOCUMENTS

| | | | |
|---|---|---|---|
| 9,047,941 B2 * | 6/2015 | Nishizawa | G11C 13/0016 |
| 9,276,216 B2 | 3/2016 | Nishizawa et al. | |
| 2006/0208252 A1 | 9/2006 | Wessels et al. | |
| 2008/0087887 A1 | 4/2008 | Cho et al. | |
| 2008/0224131 A1 | 9/2008 | Zhang et al. | |
| 2012/0241713 A1 * | 9/2012 | Nishizawa | G11C 13/0016 257/4 |
| 2014/0027699 A1 * | 1/2014 | Aoki | H01L 51/0591 257/2 |
| 2015/0069337 A1 * | 3/2015 | Nishizawa | H01L 51/005 257/40 |
| 2015/0236171 A1 | 8/2015 | Nishizawa et al. | |
| 2015/0303386 A1 * | 10/2015 | Kishino | C09K 11/06 257/40 |
| 2017/0040553 A1 * | 2/2017 | Watabe | H01L 51/0085 |
| 2017/0309687 A1 * | 10/2017 | Watabe | H01L 51/5004 |

FOREIGN PATENT DOCUMENTS

| | | |
|---|---|---|
| JP | 2006-245549 | 9/2006 |
| JP | 2008-103708 | 5/2008 |
| JP | 2008-513543 | 5/2008 |
| JP | 2012-204433 | 10/2012 |
| JP | 2012-204434 | 10/2012 |
| WO | WO 2012/127863 A1 | 9/2012 |

OTHER PUBLICATIONS

U.S. Appl. No. 14/703,075, filed May 4, 2015, U.S. Pat. No. 9,515,195, Hideyuki Nishizawa, et al.

U.S. Appl. No. 13/425,796, filed Mar. 21, 2012, U.S. Pat. No. 9,047,941, Hideyuki Nishizawa, et al.

* cited by examiner

… (US 10,559,627 B2)

MEMORY DEVICE AND RECTIFIER

CROSS-REFERENCE TO RELATED APPLICATION

This application is based upon and claims the benefit of priority from Japanese Patent Application No. 2017-056697, filed on Mar. 22, 2017, the entire contents of which are incorporated herein by reference.

FIELD

Embodiments described herein relate generally to a memory device and a rectifier.

BACKGROUND

As electronic devices are scaled down, rectifier elements are also expected to be scaled down. For example, a resistive random access memory is provided with a memory cell having a variable resistance layer at the intersection of a word line and a bit line. Application of a voltage to the variable resistance layer causes a change in the resistance of the variable resistance layer and realizes a memory function. If the memory cell does not have a rectification property, a leakage current flowing through a non-selected memory cell can cause a malfunction. The memory cell is thus preferably provided with a rectifier element.

The resistive random access memory is required to have a scaled-down memory cell in order to increase the storage capacity. For this reason, scaling-down is also required for the rectifier element provided in the memory cell. As for a pn diode utilizing a pn junction of a semiconductor, it is difficult to reduce the size to 10 nm or smaller, for example, because a reduction in size increases a tunneling current.

DETAILED DESCRIPTION

Figure 1:
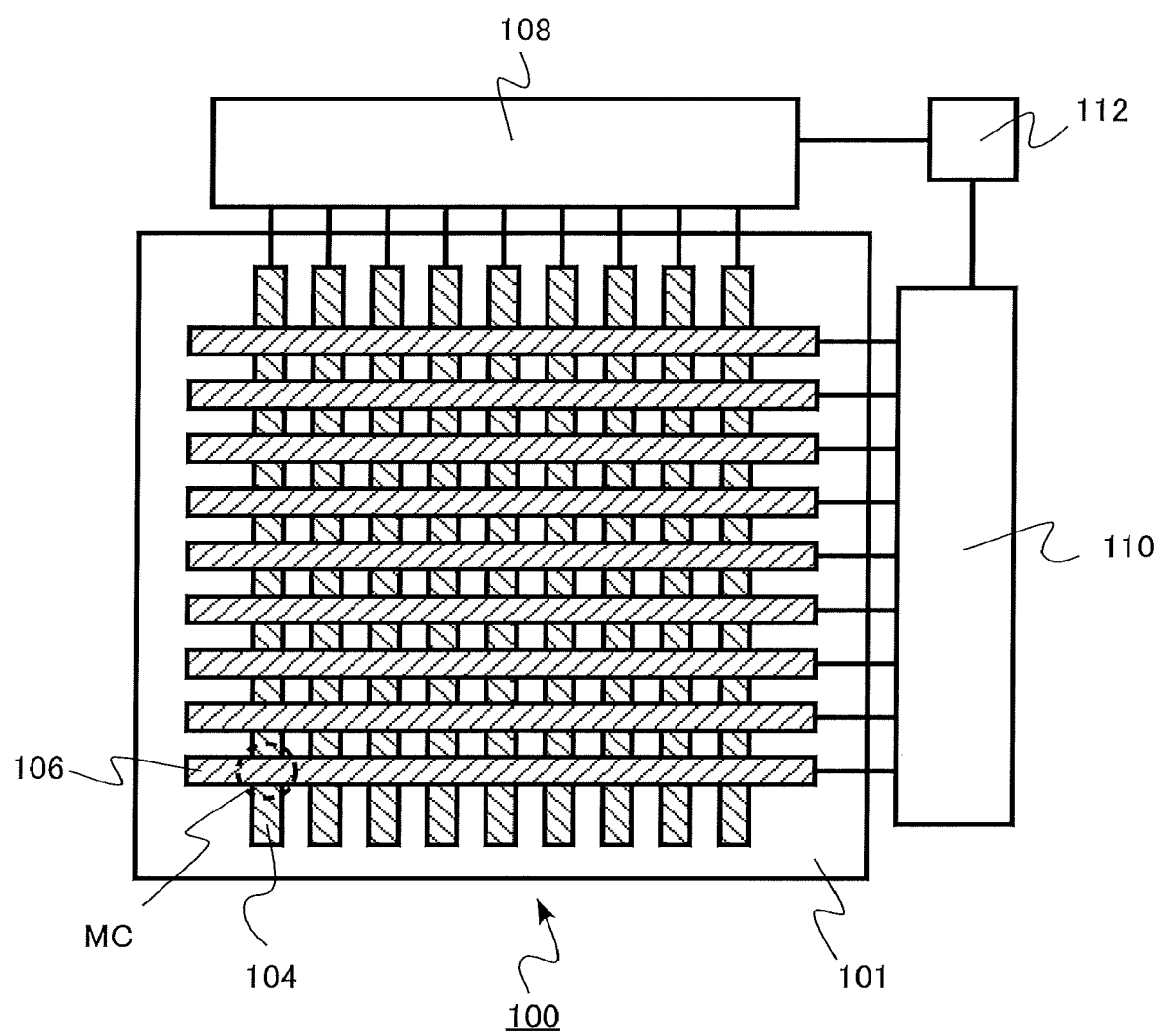
FIG. 1 is a block diagram of a memory device according to a first embodiment.

A memory device according to an embodiment includes a first conductive layer, a second conductive layer, a variable resistance layer disposed between the first conductive layer and the second conductive layer, and an organic molecular layer disposed between the variable resistance layer and the second conductive layer, the organic molecular layer containing organic molecules. Each of the organic molecules includes a first fused polycyclic unit having a first HOMO (highest occupied molecular orbital) level, a second fused polycyclic unit having a second HOMO level higher in energy than the first HOMO level, and a third fused polycyclic unit disposed between the first fused polycyclic unit and the second fused polycyclic unit. The third fused polycyclic unit has a third HOMO level higher in energy than the first HOMO level and the second HOMO level.

Embodiments of the present disclosure will now be described with reference to the drawings. In the following description, the same or similar members are denoted by the same reference numerals, and a description of a member or the like described once will be omitted as appropriate.

A memory device according to an embodiment will be described below with reference to the drawings.

(First Embodiment)

A memory device of the present embodiment includes a first conductive layer, a second conductive layer, a variable resistance layer disposed between the first conductive layer and the second conductive layer, and an organic molecular layer disposed between the variable resistance layer and the second conductive layer and containing organic molecules. The organic molecules include a first fused polycyclic unit having a first highest occupied molecular orbital (HOMO) level, a second fused polycyclic unit having a second HOMO level higher in energy than the first HOMO level, and a third fused polycyclic unit disposed between the first fused polycyclic unit and the second fused polycyclic unit and having a third HOMO level higher in energy than the first HOMO level and the second HOMO level.

Figure 2:
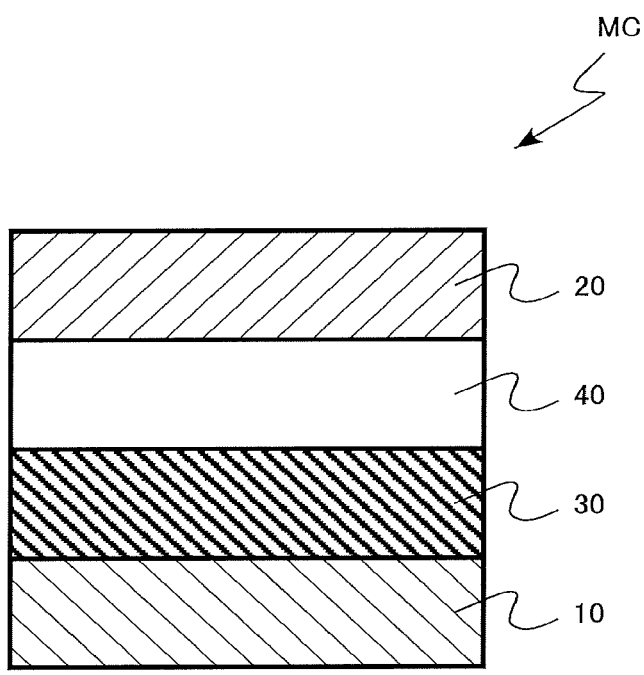
FIG. 2 is a schematic cross-sectional view of a memory cell according to the first embodiment.

FIG. 1 is a block diagram of a memory cell array 100 and peripheral circuits of the memory device according to the present embodiment. FIG. 2 is a schematic cross-sectional view of a memory cell MC of the memory device according to the present embodiment. FIG. 2 illustrates a cross section of one memory cell MC indicated by a dotted circle in the memory cell array 100 of FIG. 1, for example.

The memory cell array 100 of the memory device according to the present embodiment includes, for example, a plurality of word lines 104 and a plurality of bit lines 106 intersecting with the word lines 104 on a semiconductor substrate 101 via an insulating layer. The bit lines 106 are provided on top of the word lines 104. The peripheral circuits provided around the memory cell array 100 include a first control circuit 108, a second control circuit 110, and a sense circuit 112.

A plurality of the memory cells MC is provided in regions where the word lines 104 intersect with the bit lines 106. The memory device of the present embodiment is a resistive random access memory having a cross point structure. The memory cell MC is a two-terminal variable resistance element.

Each of the plurality of word lines 104 is connected to the first control circuit 108. Each of the plurality of bit lines 106 is connected to the second control circuit 110. The sense circuit 112 is connected to the first control circuit 108 and the second control circuit 110.

The first control circuit 108 and the second control circuit 110 have a function of selecting a desired memory cell MC and writing data to the memory cell, reading data from the memory cell, or erasing data in the memory cell, for example. At the time of data readout, data in the memory cell is read out as the amount of current flowing between the word line 104 and the bit line 106. The sense circuit 112 has a function of determining the amount of current and thus polarity of the data. The sense circuit determines whether the data is "0" or "1", for example.

Each of the first control circuit 108, the second control circuit 110, and the sense circuit 112 is formed of an electronic circuit using a semiconductor device formed on the semiconductor substrate 101, for example.

As illustrated in FIG. 2, the memory cell MC includes a lower electrode 10 (the first conductive layer), an upper electrode 20 (the second conductive layer), a variable resistance layer 30, and an organic molecular layer 40.

The lower electrode 10 is connected to the word line 104. The lower electrode 10 is made of metal, for example. The lower electrode 10 is made of titanium nitride (TiN) or tungsten (W), for example.

The upper electrode 20 is connected to the bit line 106. The upper electrode 20 is made of metal, for example. The upper electrode 20 is made of titanium nitride (TiN) or tungsten (W), for example.

The lower electrode 10 and the upper electrode 20 may be made of the same or different materials.

The variable resistance layer 30 is sandwiched between the lower electrode 10 and the upper electrode 20. The variable resistance layer 30 is made of metal oxide, for example.

The variable resistance layer 30 can be made of, for example, aluminum oxide, hafnium oxide, zirconium oxide, titanium oxide, niobium oxide, tantalum oxide, or tungsten oxide. The variable resistance layer 30 may be a single layer film or a multilayer film. The film thickness of the variable resistance layer 30 is 5 nm or larger and 25 nm or smaller, for example.

Application of a current to the variable resistance layer 30 causes a change in the resistance of the variable resistance layer 30. Let a high resistance state be defined as data "0" and a low resistance state as data "1". The memory cell MC can store one-bit data of "0" and "1".

The organic molecular layer 40 contains a plurality of organic molecules 50. The organic molecules 50 allow the organic molecular layer 40 to have a rectification property. The film thickness of the organic molecular layer 40 is 1 nm or larger and 10 nm or smaller, for example.

The film thickness of each layer can be measured by using a transmission electron microscope (TEM), for example.

Figure 3A:
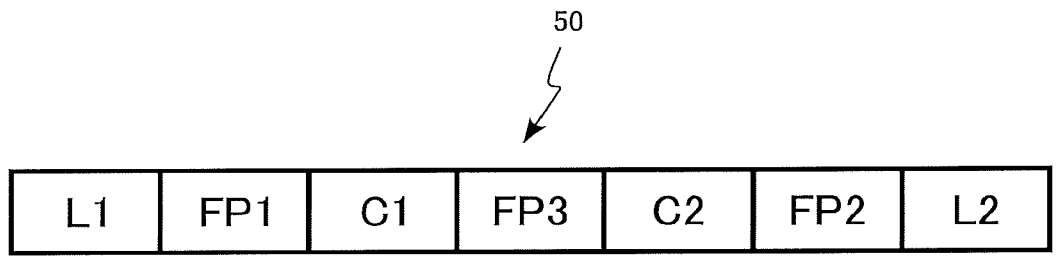
FIGS. 3A, 3B, and 3C are diagrams illustrating organic molecules according to the first embodiment.
Figure 3B:
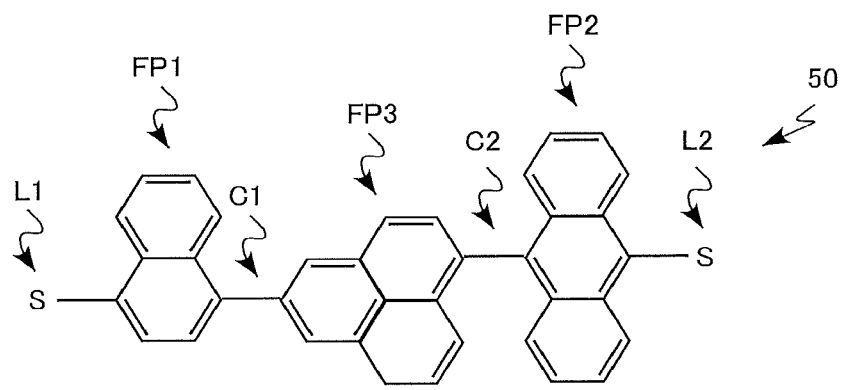
Figure 3C:
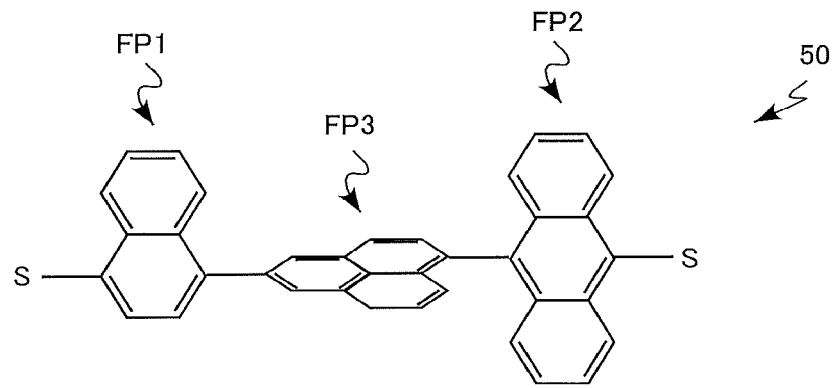

FIGS. 3A, 3B, and 3C are diagrams illustrating the structure of the organic molecules 50 according to the present embodiment. FIG. 3A is a schematic diagram of the structure of the organic molecules 50, and each of FIGS. 3B and 3C is a diagram illustrating an example of the organic molecules 50.

As illustrated in FIG. 3A, each of the organic molecules 50 include a first fused polycyclic unit FP1, a second fused polycyclic unit FP2, a third fused polycyclic unit FP3, a first connector C1, a second connector C2, a first linker L1, and a second linker L2.

The third fused polycyclic unit FP3 is provided between the first fused polycyclic unit FP1 and the second fused polycyclic unit FP2. The first connector C1 is provided between the first fused polycyclic unit FP1 and the third fused polycyclic unit FP3. The second connector C2 is provided between the second fused polycyclic unit FP2 and the third fused polycyclic unit FP3.

The first fused polycyclic unit FP1 has a first highest occupied molecular orbital (HOMO) level. The second fused polycyclic unit FP2 has a second HOMO level. The third fused polycyclic unit FP3 has a third HOMO level.

The second HOMO level is higher in energy than the first HOMO level. The third HOMO level is higher in energy than the second HOMO level. Note that "the energy of the HOMO level is high" is synonymous with "the energy difference between a vacuum level and the HOMO level is small".

In the present specification, the HOMO level of the fused polycyclic unit represents the HOMO level when the fused polycyclic unit is in a single molecular state. The HOMO level when the fused polycyclic unit is in the single molecular state can be calculated on the basis of a molecular orbital method if the structure of the fused polycyclic unit is determined.

The first fused polycyclic unit FP1 and the second fused polycyclic unit FP2 have a function of adjusting the level of the electron orbit. In other words, the first fused polycyclic unit FP1 and the second fused polycyclic unit FP2 have a function of adjusting the tunnel level on the side of the lower electrode 10 and the tunnel level on the side of the upper electrode 20. The third fused polycyclic unit FP3 has a function of preventing direct tunneling between the lower electrode 10 and the upper electrode 20.

The first fused polycyclic unit FP1 and the third fused polycyclic unit FP3 are non-conjugated, for example. The second fused polycyclic unit FP2 and the third fused polycyclic unit FP3 are also non-conjugated, for example.

The first connector C1 has a function of connecting the first fused polycyclic unit FP1 and the third fused polycyclic unit FP3. The second connector C2 has a function of connecting the second fused polycyclic unit FP2 and the third fused polycyclic unit FP3. The first linker L1 and the second linker L2 have a function of fixing the organic molecules 50 to either one of the variable resistance layer 30 and the upper electrode 20.

FIG. 3B is a diagram illustrating an example of the organic molecules 50. In the organic molecules 50, the first fused polycyclic unit FP1 contains a first fused polycyclic aromatic hydrocarbon, the second fused polycyclic unit FP2 contains a second fused polycyclic aromatic hydrocarbon, and the third fused polycyclic unit FP3 contains a third fused polycyclic aromatic hydrocarbon. The first fused polycyclic aromatic hydrocarbon is naphthalene. The second fused polycyclic aromatic hydrocarbon is anthracene. The third fused polycyclic aromatic hydrocarbon is phenalene. The first connector C1 and the second connector C2 are single bonds. Each of the first linker L1 and the second linker L2 is a thiolate anion or a thioether group.

FIG. 3C illustrates a three-dimensional image of the organic molecules 50 of FIG. 3B. The organic molecules 50 of FIG. 3B are energetically stable when the face formed by a benzene ring of phenalene being the third fused polycyclic aromatic hydrocarbon is rotated with respect to the face formed by a benzene ring of naphthalene being the first fused polycyclic aromatic hydrocarbon and the face formed by a benzene ring of anthracene being the second fused polycyclic aromatic hydrocarbon. In other words, the face formed by the benzene ring of the third fused polycyclic aromatic hydrocarbon is energetically stable when substantially orthogonal to the faces formed by the benzene rings of the first fused polycyclic aromatic hydrocarbon and the second fused polycyclic aromatic hydrocarbon.

Figure 4:
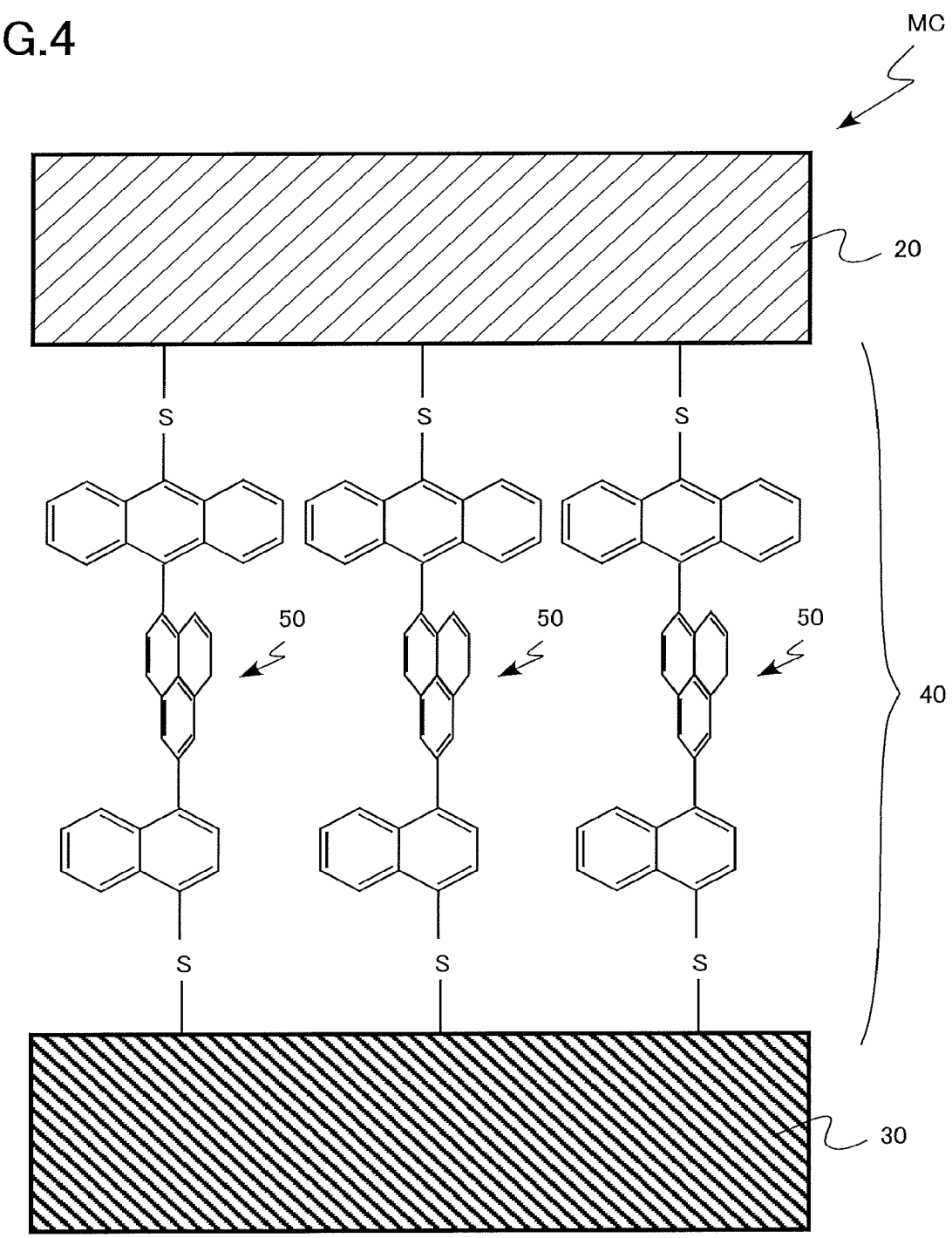
FIG. 4 is an enlarged schematic cross-sectional view of the memory cell according to the first embodiment.

FIG. 4 is an enlarged schematic cross-sectional view of an example of the memory cell MC according to the present embodiment. The organic molecular layer 40 contains a plurality of organic molecules 50. As illustrated in FIG. 4, one end of the organic molecules 50 is bonded and fixed to the variable resistance layer 30. Another end of the organic molecules 50 is bonded and fixed to the upper electrode 20.

Figure 5A:
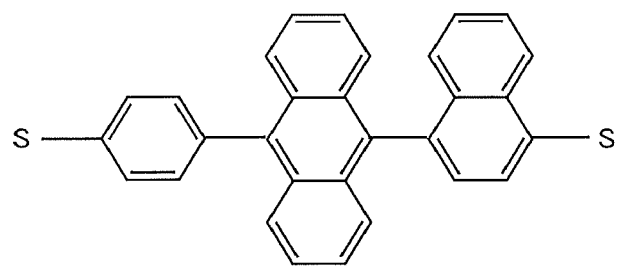
FIGS. 5A, 5B, and 5C are diagrams illustrating the organic molecules according to the first embodiment.
Figure 5B:
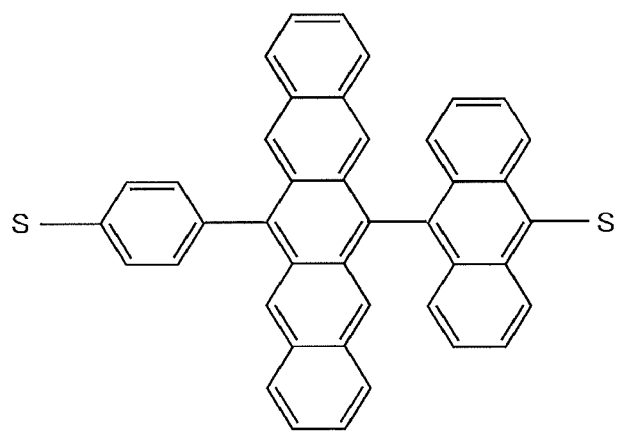
Figure 5C:
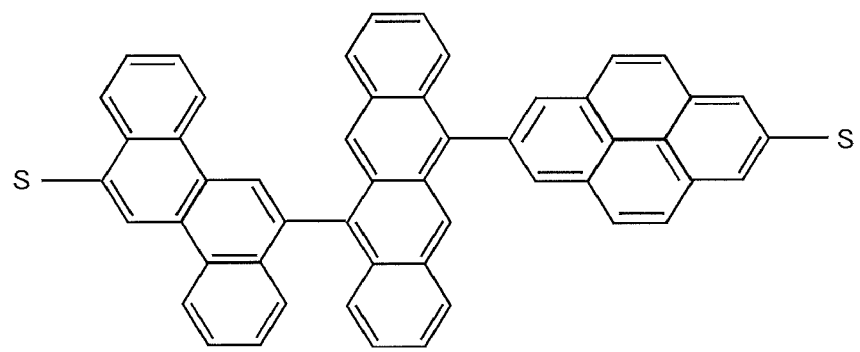

FIGS. 5A, 5B, and 5C are diagrams illustrating specific examples of the organic molecules 50. Three fused polycyclic units in FIGS. 5A, 5B, and 5C represent the first fused polycyclic unit FP1, the third fused polycyclic unit FP3, and the second fused polycyclic unit FP2 from the left.

The organic molecules 50 of the present embodiment are not limited to the examples illustrated in FIGS. 3A, 3B, 3C, 5A, 5B, and 5C.

The first fused polycyclic unit FP1, the second fused polycyclic unit FP2, and the third fused polycyclic unit FP3 may have any molecular structures as long as they satisfy the aforementioned relationship pertaining to the energy of the HOMO levels.

A fused polycyclic group contained in each of the first fused polycyclic unit FP1, the second fused polycyclic unit FP2, and the third fused polycyclic unit FP3 is a fused polycyclic aromatic hydrocarbon or a heterocyclic ring compound.

The number of fused polycyclic groups contained in each of the first fused polycyclic unit FP1, the second fused polycyclic unit FP2, and the third fused polycyclic unit FP3 is 10 or less, for example.

A substituent may be bonded to at least one of the fused polycyclic groups contained in the first fused polycyclic unit FP1, the second fused polycyclic unit FP2, and the third fused polycyclic unit FP3.

Figure 6:
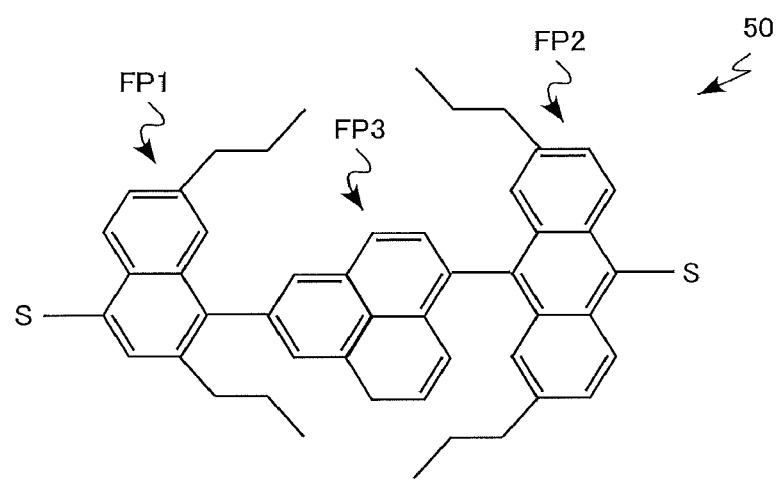
FIG. 6 is a diagram illustrating the organic molecules according to the first embodiment.

FIG. 6 is a diagram illustrating an example of the organic molecules 50. Substituents are bonded to the first fused polycyclic unit FP1 and the second fused polycyclic unit FP2 of the organic molecules illustrated in FIG. 3B.

Specifically, two alkyl chains are bonded to the first fused polycyclic aromatic hydrocarbons contained in the first fused polycyclic unit FP1. The two alkyl chains are bonded to the first fused polycyclic unit FP1 at positions facing the third fused polycyclic unit FP3. Similarly, two alkyl chains are bonded to the second fused polycyclic aromatic hydrocarbons contained in the second fused polycyclic unit FP2. The two alkyl chains are bonded to the second fused polycyclic unit FP2 at positions facing the third fused polycyclic unit FP3.

The alkyl chain is a substituent functioning as a steric hindrance. Not only the alkyl chain but another substituent such as an alkylamino group, an aryl group, an alkylsilyl group, a thioalkyl group, or the like can be used as the substituent functioning as a steric hindrance.

A substituent modulating the electron density of the organic molecules 50 may be bonded to at least one of the fused polycyclic groups contained in the first fused polycyclic unit FP1, the second fused polycyclic unit FP2, and the third fused polycyclic unit FP3. The substituent modulating the electron density of the organic molecules 50 can be a halo group, a nitro group, an alkyl group partially containing a halo group, an amino group, an acyl group, a carbonyl group, a hydroxyl group, or a sulfo group, for example.

The first linker L1 and the second linker L2 are not limited to thioether groups. An appropriate group may be selected depending on the materials of the variable resistance layer 30 and the upper electrode 20. For example, a dialkyl silyl ether group, an ether group, a phosphonic acid ester group, an ester group, or an azo group can be used.

The organic molecules 50 can also be structured without including the first linker L1 nor the second linker L2.

The first connector C1 and the second connector C2 are not limited to single bonds. The first connector C1 need only have a function of bonding the first fused polycyclic unit FP1 and the third fused polycyclic unit FP3, and the second connector C2 need only have a function of connecting the second fused polycyclic unit FP2 and the third fused polycyclic unit FP3. For example, bicyclooctane can be used as the connector.

The molecular structure of the organic molecules 50 can be identified by using an atomic force microscope (AFM) or a scanning tunneling microscope (STM), for example.

The function and effect of the memory device according to the present embodiment will now be described.

The memory device of the present embodiment realizes a memory function by applying a voltage to the variable resistance layer 30 and changing the resistance of the variable resistance layer 30. Moreover, the organic molecules 50 contained in the organic molecular layer 40 have a rectifying function. The organic molecular layer 40 is thus a rectifier element having the rectification property. This rectification property of the organic molecular layer 40 prevents a malfunction caused by a leakage current flowing through a non-selected memory cell, for example. The resistive random access memory can thus operate with stability.

The rectifying function of the organic molecules 50 of the present embodiment will now be described in detail.

Figure 7:
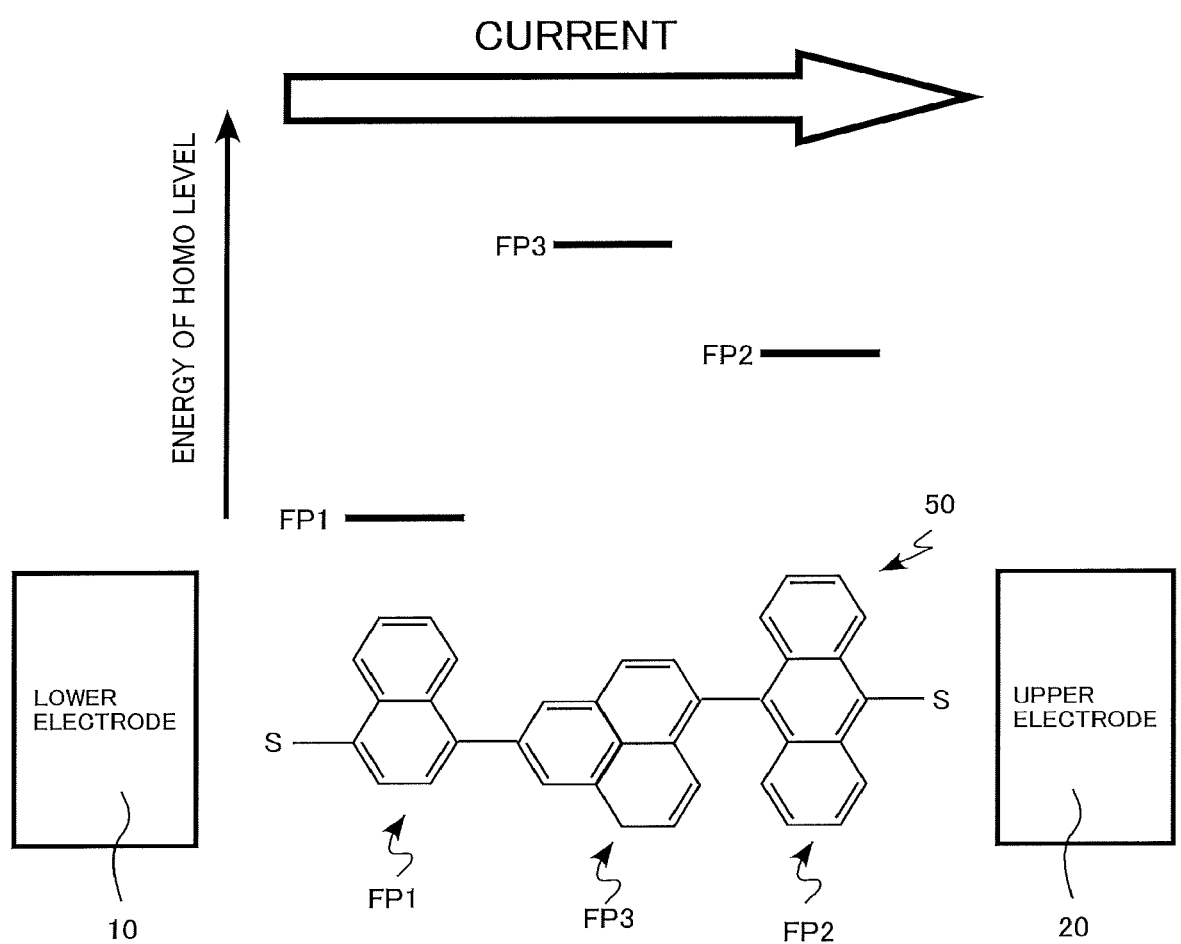
FIG. 7 is an explanatory diagram of a rectifying function of the organic molecules according to the first embodiment.

FIG. 7 is an explanatory diagram of the rectifying function of the organic molecules 50 according to the present embodiment. FIG. 7 illustrates an example where the lower electrode 10 and the upper electrode 20 are disposed on the sides of the first fused polycyclic unit FP1 and the second fused polycyclic unit FP2 of the organic molecules 50, respectively.

In the organic molecules 50 of the present embodiment, the first fused polycyclic unit FP1 has the first HOMO level. The second fused polycyclic unit FP2 has the second HOMO level. The third fused polycyclic unit FP3 has the third HOMO level.

As illustrated in FIG. 7, the second HOMO level is higher in energy than the first HOMO level. The third HOMO level is higher in energy than the second HOMO level.

The energy of the third HOMO level is set high so that a linkage of the molecular orbital possibly tunneling between the lower electrode 10 and the upper electrode 20 is disrupted on the left and right sides of the third fused polycyclic unit FP3. In other words, the tunnel level on the side of the lower electrode 10 and the tunnel level on the side of the upper electrode 20 can be set independently. As a result, the amount of current flowing through the lower electrode 10 and the upper electrode 20 is dependent on the polarity of the voltage applied to the lower electrode 10 and the upper electrode 20.

In the case of FIG. 7, the difference in energy between the third HOMO level and the first HOMO level is larger than the difference in energy between the third HOMO level and the second HOMO level. This causes holes to flow readily from the lower electrode 10 toward the upper electrode 20. As a result, a current is more likely to flow in the direction indicated by a white arrow in FIG. 7. In other words, a current flows easily when a relatively positive voltage is applied to the lower electrode 10, or flows less easily when a relatively positive voltage is applied to the upper electrode 20.

The organic molecules 50 are thought to have the rectifying function due to the aforementioned function.

The third fused polycyclic unit FP3 is thought to disrupt the tunneling probability in such a way that the first fused polycyclic unit FP1 and the third fused polycyclic unit FP3 are non-conjugated, and that the second fused polycyclic unit FP2 and the third fused polycyclic unit FP3 are nonconjugated. That is, the tunneling probability is thought to be disrupted by localizing the molecular orbitals of the first fused polycyclic unit FP1, the second fused polycyclic unit FP2, and the third fused polycyclic unit FP3.

The molecular orbitals are localized when, for example, the face formed by the phenyl group of the third fused polycyclic aromatic hydrocarbon is substantially orthogonal to the faces formed by the phenyl groups of the first fused polycyclic aromatic hydrocarbon and the second fused polycyclic aromatic hydrocarbon as illustrated in FIG. 3C.

It is thus desirable that the third fused polycyclic aromatic hydrocarbon rotates easily with respect to the first fused polycyclic aromatic hydrocarbon and the second fused polycyclic aromatic hydrocarbon. Accordingly, the first connector C1 and the second connector C2 are desirably single bonds.

Note that an increase in the lengths of the structures of the first connector C1 and the second connector C2 causes an increase in the resistance of the organic molecular layer 40 and a possible increase in an on-resistance of the memory cell. From this point of view as well, the first connector C1 and the second connector C2 are desirably single bonds being short in length.

In terms of stabilizing the rectifying function of the organic molecules 50, it is preferable to stably maintain the state in which the face formed by the phenyl group of the third fused polycyclic aromatic hydrocarbon is substantially orthogonal to the faces formed by the phenyl groups of the first fused polycyclic aromatic hydrocarbon and the second fused polycyclic aromatic hydrocarbon. From this point of view, a substituent functioning as a steric hindrance is desirably bonded to at least one of the fused polycyclic groups included in the first fused polycyclic unit FP1, the second fused polycyclic unit FP2, and the third fused polycyclic unit FP3. The substituent functioning as a steric hindrance is preferably provided at a position where the first fused polycyclic unit FP1 and the third fused polycyclic unit FP3 are opposed to each other, or at a position where the second fused polycyclic unit FP2 and the third fused polycyclic unit FP3 are opposed to each other as illustrated in FIG. 6.

The rectification property of the organic molecules 50 can be modulated by bonding a substituent modulating the electron density of the organic molecules to at least one of the fused polycyclic groups included in the first fused polycyclic unit FP1, the second fused polycyclic unit FP2, and the third fused polycyclic unit FP3. For example, introduction of a substituent such as a nitro group to FP2 decreases the electron density of FP2 and increases the energy of the HOMO level, and is thus thought to enhance the rectification property.

In terms of facilitating the synthesis of the organic molecules 50, it is preferable that the number of the fused polycyclic groups contained in each of the first fused polycyclic unit FP1, the second fused polycyclic unit FP2, and the third fused polycyclic unit FP3 is five or less, for example.

The organic molecules 50 preferably include at least one of the first linker L1 and the second linker L2 in terms of fixing the organic molecules 50 to at least one of the variable resistance layer 30 and the upper electrode 20 and stabilizing the rectifying function of the organic molecules 50. The organic molecules 50 more preferably include both the first linker L1 and the second linker L2 to be fixed to both the variable resistance layer 30 and the upper electrode 20.

The fused polycyclic groups contained in the first fused polycyclic unit FP1, the second fused polycyclic unit FP2, and the third fused polycyclic unit FP3 are preferably fused polycyclic aromatic hydrocarbons. The fused polycyclic aromatic hydrocarbon has high thermal stability. The rectifying function of the organic molecules 50 is thus stabilized.

In terms of facilitating the synthesis of the organic molecules 50, the first connector C1 and the second connector C2 are preferably bonded to the ring close to the center of each of the first fused polycyclic unit FP1, the second fused polycyclic unit FP2, and the third fused polycyclic unit FP3.

The lower electrode 10 and the upper electrode 20 are preferably made of the same material. For example, the lower electrode 10 and the upper electrode 20 are preferably made of the same metal material. It is possible to prevent a malfunction of the memory cell MC caused when the current arising from a battery effect flows between the lower electrode 10 and the upper electrode 20.

The organic molecules can have the rectifying function with a structure such as a D-σ-A structure in which an electron donating group D (donor) and an electron withdrawing group A (acceptor) are bonded via a sigma bond or a D-π-A structure in which the electron donating group D and the electron withdrawing group A are bonded via a pi bond. The organic molecules having the D-σ-A structure or the D-π-A structure cause a current to flow by ionization of molecules. As a result, the molecular skeleton is prone to degradation and degrades to a large extent over time.

The organic molecules 50 of the present embodiment cause a current to flow by a mechanism not involving ionization of molecules. Accordingly, the molecular skeleton is less prone to degradation and degrades to a lesser extent over time. The resistive random access memory with high reliability can be realized as a result.

The length of the organic molecules 50 contained in the organic molecular layer 40 is 10 nm or shorter, for example. The film thickness of the organic molecular layer 40 can thus be set to 10 nm or smaller. This allows scaling-down of the memory cell MC and can realize the resistive random access memory having a large capacity.

As described above, the present embodiment can realize the resistive random access memory which includes the memory cell MC with the scaled-down rectifier element and can be operated stably as well as increased in the capacity. Moreover, the resistive random access memory realized in the present embodiment has the rectifier element degrading to a lesser extent over time and has high reliability.

(Second Embodiment)

A rectifier of the present embodiment includes a first conductive layer, a second conductive layer, and an organic molecular layer disposed between the first conductive layer and the second conductive layer and containing organic molecules. The organic molecules include a first fused polycyclic unit having a first HOMO level, a second fused polycyclic unit having a second HOMO level higher in energy than the first HOMO level, and a third fused polycyclic unit disposed between the first fused polycyclic unit and the second fused polycyclic unit and having a third HOMO level higher in energy than the first HOMO level and the second HOMO level.

The rectifier according to the present embodiment is different from the first embodiment in that the lower electrode, the upper electrode, and the organic molecular layer of the memory cell MC of the first embodiment are used as a single diode. Content overlapping with the first embodiment will not be described.

Figure 8:
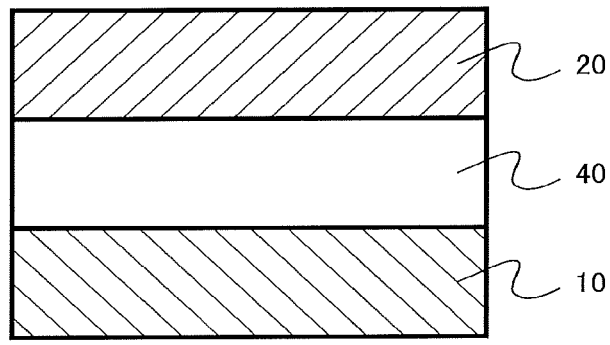
FIG. 8 is a schematic cross-sectional view of a rectifier according to a second embodiment.

FIG. 8 is a schematic cross-sectional view of a diode according to the present embodiment. As illustrated in FIG. 8, the diode includes a lower electrode 10 (the first conductive layer), an upper electrode 20 (the second conductive layer), and an organic molecular layer 40.

The organic molecular layer 40 has a rectifying function as described in the first embodiment. Organic molecules 50 contained in the organic molecular layer 40 are fine and degrade to a small extent over time.

The diode of the present embodiment can be used as a rectifier element in circuits of various electronic devices, for example.

The organic molecules 50 are preferably bonded to at least one of the lower electrode 10 and the upper electrode 20 by at least one of a first linker L1 and a second linker L2.

The present embodiment can thus realize the rectifier including the rectifier element which is fine and degrades to a small extent over time.

(Third Embodiment)

A memory device of the present embodiment is similar to that of the first embodiment except that a memory cell array has a three-dimensional structure. Content overlapping with the first embodiment will not be described.

Figure 9:
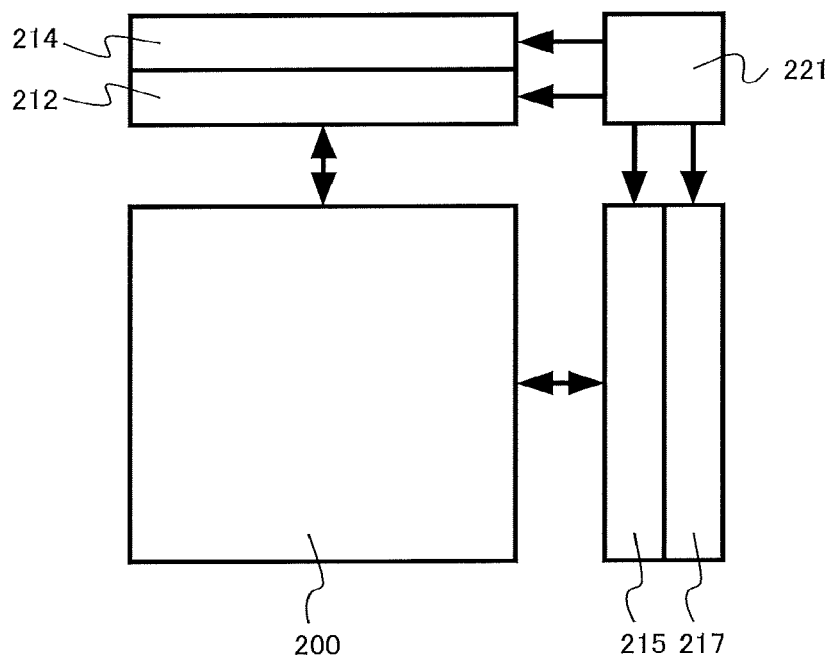
FIG. 9 is a block diagram of a memory device according to a third embodiment.
Figure 10:
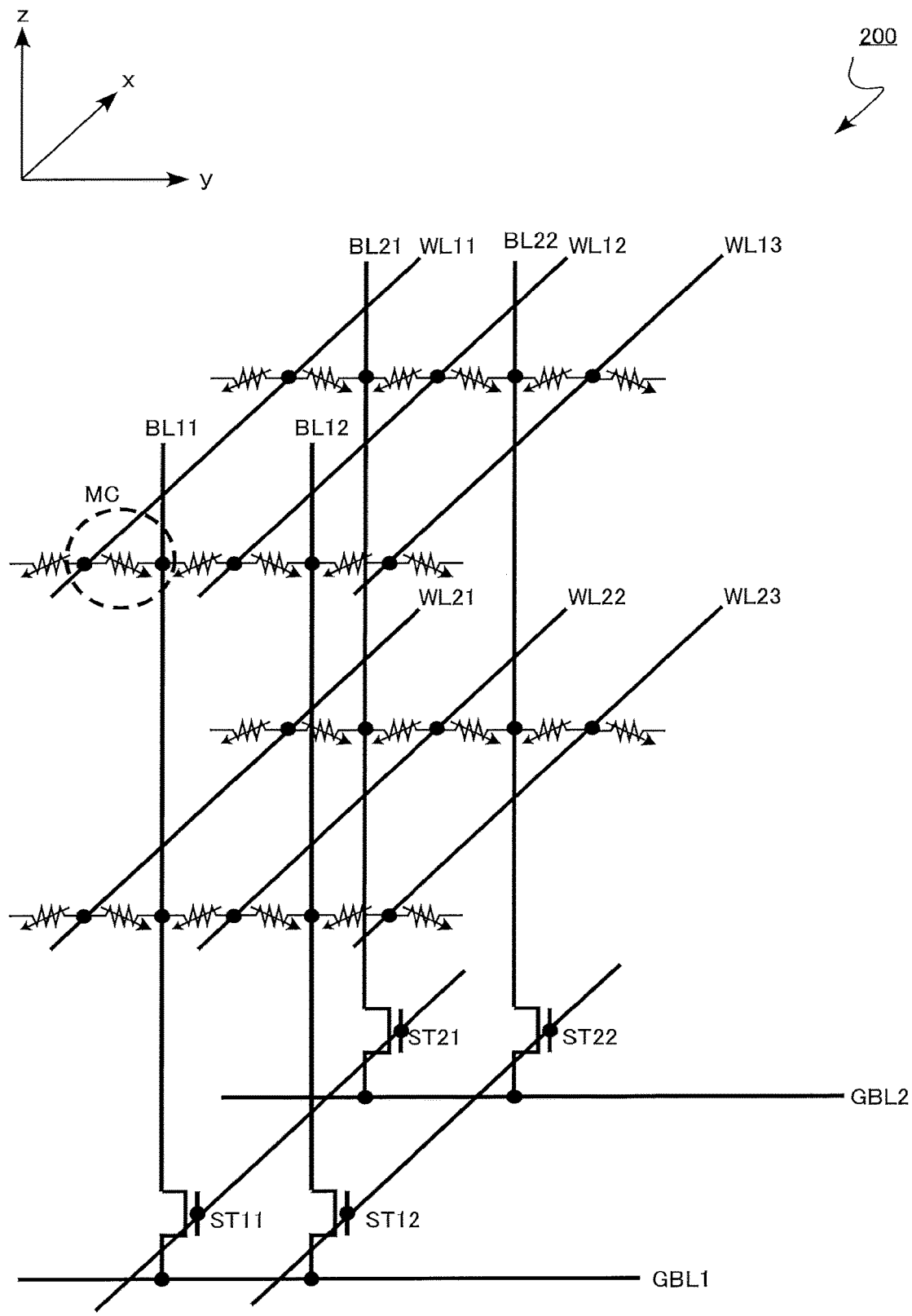
FIG. 10 is an equivalent circuit diagram of a memory cell array according to the third embodiment.
Figure 11A:
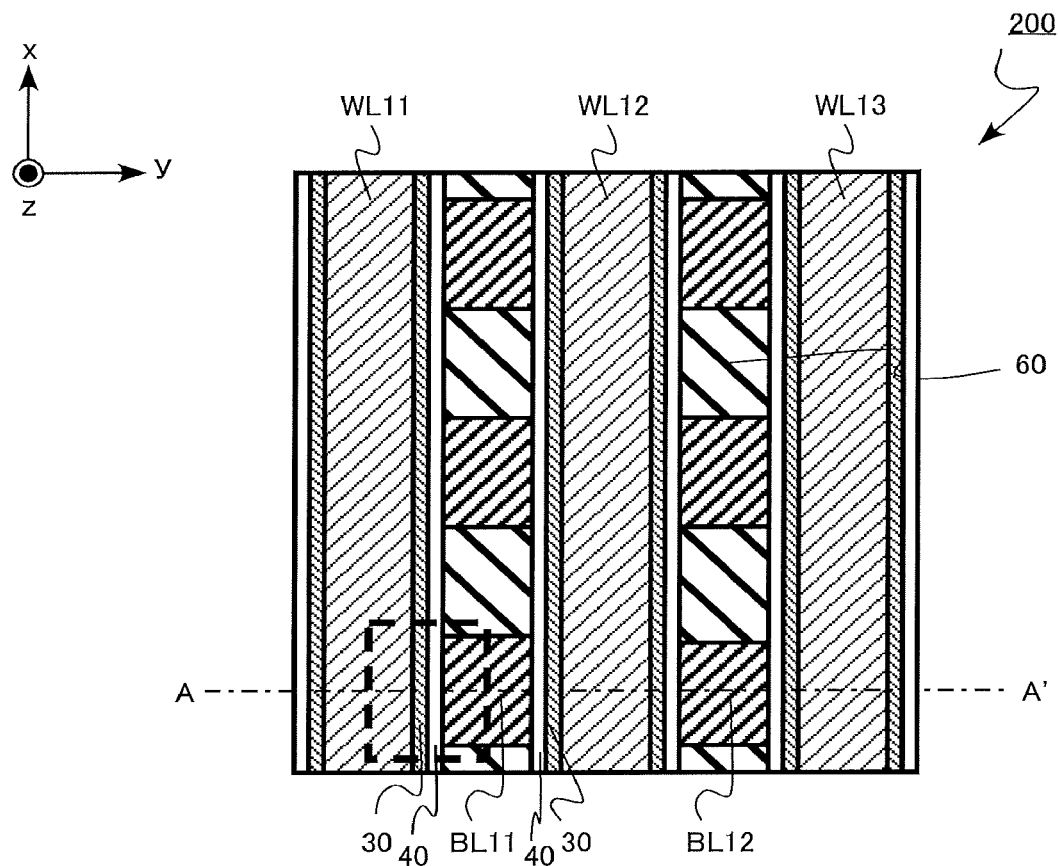
FIGS. 11A and 11B are schematic cross-sectional views of the memory cell array according to the third embodiment.
Figure 11B:
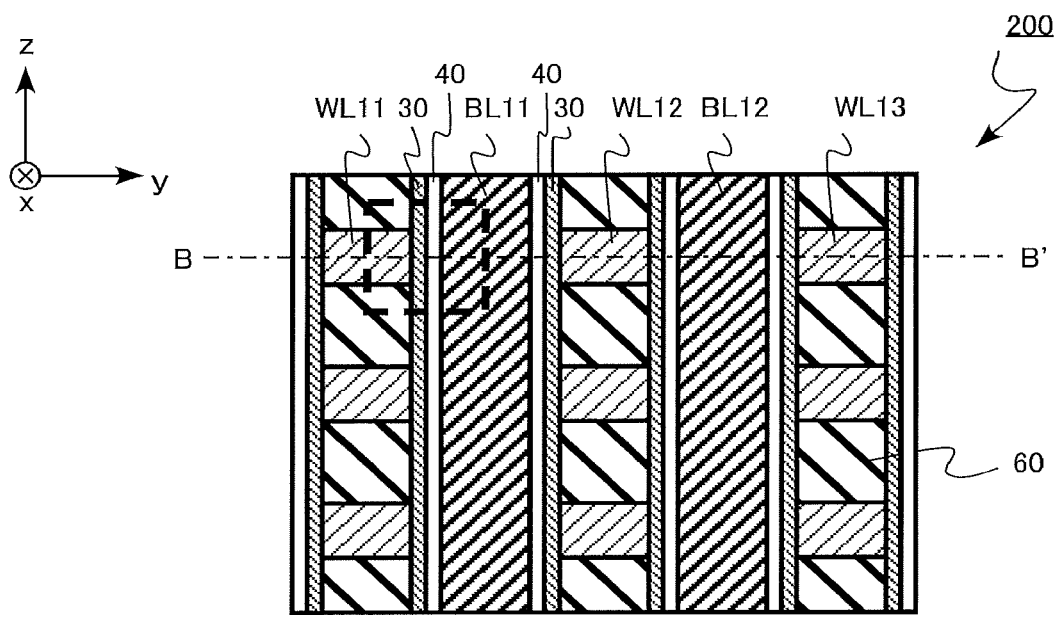

FIG. 9 is a block diagram of the memory device of the present embodiment. FIG. 10 is an equivalent circuit diagram of the memory cell array. FIGS. 11A and 11B are schematic cross-sectional views of the memory cell array.

The memory cell array of the present embodiment has the three-dimensional structure in which memory cells MC are disposed three-dimensionally.

As illustrated in FIG. 9, the memory device includes a memory cell array 200, a word line driver circuit 212, a row decoder circuit 214, a sense amplifier circuit 215, a column decoder circuit 217, and a control circuit 221.

As illustrated in FIG. 10, a plurality of the memory cells MC is disposed three-dimensionally in the memory cell array 200. A region enclosed by a dashed line in FIG. 10 corresponds to one memory cell MC.

The memory cell array 200 includes a plurality of word lines WL (WL11, WL12, WL13, WL21, WL22, and WL23) and a plurality of bit lines BL (BL11, BL12, BL21, and BL22), for example. The word lines WL extend in an x direction. The bit lines BL extend in a z direction. The word lines WL and the bit lines BL cross each other at right angles. The memory cells MC are disposed at intersections of the word lines WL and the bit lines BL.

The plurality of word lines WL is electrically connected to the row decoder circuit 214. The plurality of bit lines BL is connected to the sense amplifier circuit 215. Selection transistors ST (ST11, ST21, ST12, and ST22) and global bit lines GBL (GBL1 and GBL2) are provided between the plurality of bit lines BL and the sense amplifier circuit 215.

The row decoder circuit 214 has a function of selecting the word line WL according to a row address signal being input. The word line driver circuit 212 has a function of applying a predetermined voltage to the word line WL selected by the row decoder circuit 214.

The column decoder circuit 217 has a function of selecting the bit line BL according to a column address signal being input. The sense amplifier circuit 215 has a function of applying a predetermined voltage to the bit line BL selected by the column decoder circuit 217. The sense amplifier circuit also has a function of detecting and amplifying the current flowing between the word line WL being selected and the bit line BL being selected.

The control circuit 221 has a function of controlling the word line driver circuit 212, the row decoder circuit 214, the sense amplifier circuit 215, the column decoder circuit 217, and another circuit not shown.

The circuits such as the word line driver circuit 212, the row decoder circuit 214, the sense amplifier circuit 215, the column decoder circuit 217, and the control circuit 221 are formed of a transistor using a semiconductor layer and a wiring layer not shown, for example.

FIGS. 11A and 11B are schematic cross-sectional views of the memory cell array 200 of the memory device according to the present embodiment. FIG. 11A is an xy cross-sectional view of the memory cell array 200. FIG. 11B is a yz cross-sectional view of the memory cell array 200. FIG. 11A is a cross-sectional view taken along line BB' of FIG. 11B, and FIG. 11B is a cross-sectional view taken along line AA' of FIG. 11A. In FIGS. 11A and 11B, a region enclosed by a dashed line corresponds to one memory cell MC.

The memory cell array 200 includes the word line WL11, the word line WL12, the word line WL13, the bit line BL11, and the bit line BL12. The memory cell array further includes a variable resistance layer 30, an organic molecular layer 40, and an interlayer insulating layer 60.

The organic molecular layer 40 of the first embodiment is applied as the organic molecular layer 40. The organic molecular layer 40 of the first embodiment can be thinned and is suitable for scaling-down in the lateral direction (x and y directions) of the present embodiment having the three-dimensional structure.

The three-dimensional structure according to the present embodiment can further increase a degree of integration of a resistive random access memory in addition to producing the effects of the first embodiment.

While certain embodiments have been described, these embodiments have been presented by way of example only, and are not intended to limit the scope of the inventions. Indeed, a memory device and a rectifier described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
   a first conductive layer;
   a second conductive layer;
   a variable resistance layer disposed between the first conductive layer and the second conductive layer; and
   an organic molecular layer disposed between the variable resistance layer and the second conductive layer, the organic molecular layer containing organic molecules, wherein:
   the organic molecules are selected from structures (1), (2), (3), and (4) listed below;
   each of the organic molecules selected from structures (1), (2), (3), and (4) includes a first fused polycyclic aromatic hydrocarbon having a first HOMO (highest occupied molecular orbital) level, a second fused polycyclic aromatic hydrocarbon having a second HOMO level higher in energy than the first HOMO level, and a third fused polycyclic aromatic hydrocarbon disposed between the first fused polycyclic aromatic hydrocarbon and the second fused polycyclic aromatic hydrocarbon, the third fused polycyclic aromatic hydrocarbon has a third HOMO level higher in energy than the first HOMO level and the second HOMO level, and FP1, FP2, FP3, L1, and L2 in structures (1), (2), (3), and (4) indicate the first fused polycyclic aromatic hydrocarbon, the second fused polycyclic aromatic hydrocarbon, the third fused polycyclic aromatic hydrocarbon, a first linker, and a second linker, respectively structure (1)

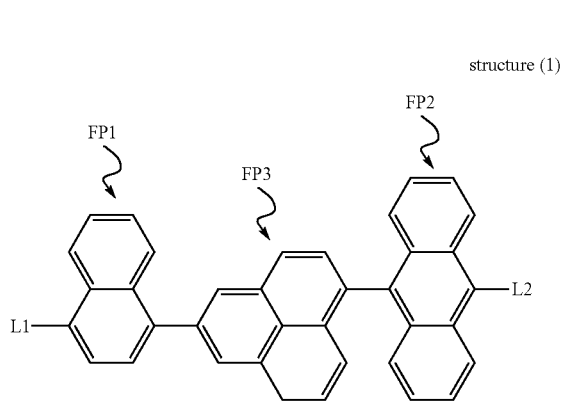

structure (2)

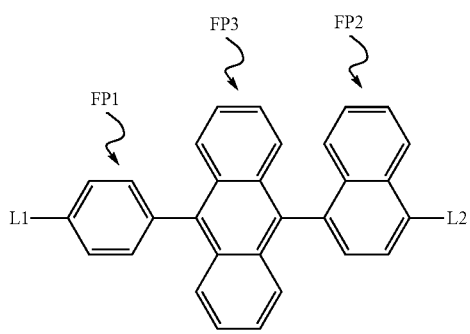

structure (3)

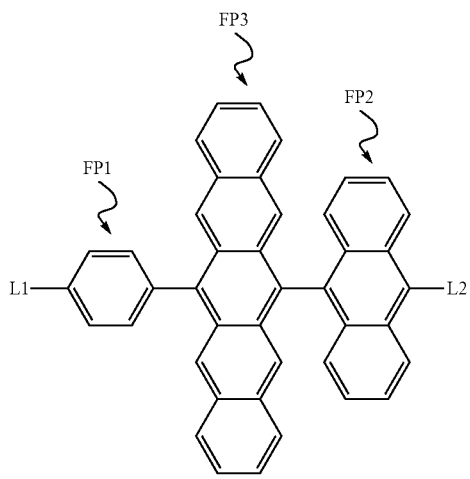

structure (4)

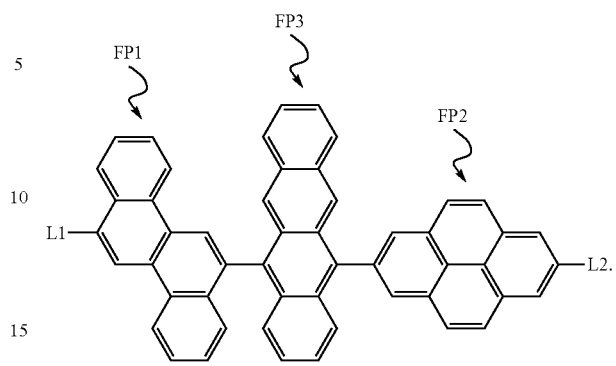

2. The memory device according to claim 1, wherein in structures (1), (2), (3), and (4) at least one substituent is bonded to at least one of the first fused polycyclic aromatic hydrocarbon, the second fused polycyclic aromatic hydrocarbon, and the third fused polycyclic aromatic hydrocarbon, and wherein the at least one substituent is selected from a halo group, a nitro group, an alkyl group partially containing a halo group, an amino group, an acyl group, a carbonyl group, a hydroxyl group, and a sulfo group.

3. The memory device according to claim 1, wherein the first fused polycyclic aromatic hydrocarbon and the third fused polycyclic aromatic hydrocarbon are non-conjugated, and the second fused polycyclic aromatic hydrocarbon and the third fused polycyclic aromatic hydrocarbon are non-conjugated.

4. The memory device according to claim 1, wherein the first linker and the second linker include a group selected from a thioether group, a dialkyl silyl ether group, an ether group, a phosphonic acid ester group, an ester group, and an azo group.

5. The memory device according to claim 1, wherein the first conductive layer and the second conductive layer are made of same metal material.

6. The memory device according to claim 1, wherein the organic molecular layer has a film thickness of 10 nm or smaller.

7. The memory device according to claim 1, wherein the organic molecular layer contains organic molecules of structure (1).

8. The memory device according to claim 1, wherein the organic molecular layer contains organic molecules of structure (2).

9. The memory device according to claim 1, wherein the organic molecular layer contains organic molecules of structure (3).

10. The memory device according to claim 1, wherein the organic molecular layer contains organic molecules of structure (4).

11. A rectifier comprising:
a first conductive layer;
a second conductive layer; and
an organic molecular layer disposed between the first conductive layer and the second conductive layer, and the organic molecular layer containing organic molecules, wherein:
the organic molecules are selected from structures (1), (2), (3), and (4) listed below;
each of the organic molecules selected from structures (1), (2), (3), and (4) includes a first fused polycyclic aromatic hydrocarbon having a first HOMO (highest occupied molecular orbital) level, a second fused polycyclic aromatic hydrocarbon having a second HOMO level higher in energy than the first HOMO level, and a third fused polycyclic aromatic hydrocarbon disposed between the first fused polycyclic aromatic hydrocarbon and the second fused polycyclic aromatic hydrocarbon, the third fused polycyclic aromatic hydrocarbon has a third HOMO level higher in energy than the first HOMO level and the second HOMO level, and FP1, FP2, FP3, L1, and L2 in structures (1), (2), (3), and (4) indicate the first fused polycyclic aromatic hydrocarbon, the second fused polycyclic aromatic hydrocarbon, the third fused polycyclic aromatic hydrocarbon, a first linker, and a second linker, respectively

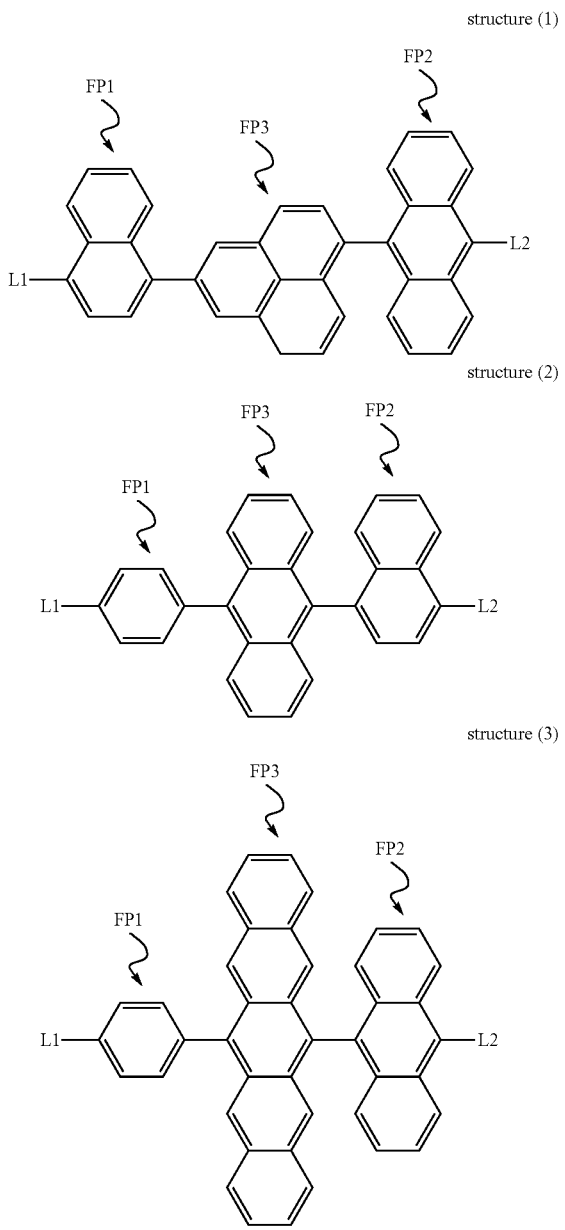

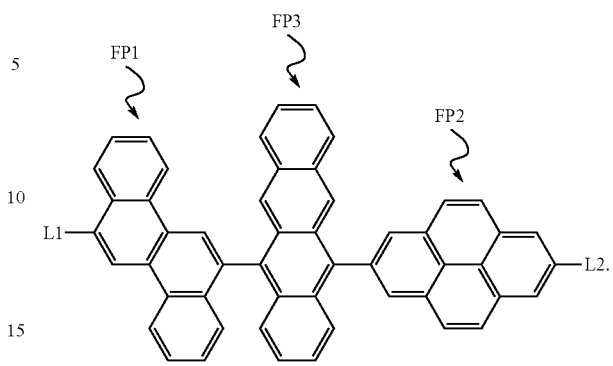

12. The rectifier according to claim 11, wherein in structures (1), (2), (3), and (4) at least one substituent is bonded to at least one of the first fused polycyclic aromatic hydrocarbon, the second fused polycyclic aromatic hydrocarbon, and the third fused polycyclic aromatic hydrocarbon, and wherein the at least one substituent is selected from a halo group, a nitro group, an alkyl group partially containing a halo group, an amino group, an acyl group, a carbonyl group, a hydroxyl group, and a sulfo group.

13. The rectifier according to claim 11, wherein the first fused polycyclic aromatic hydrocarbon and the third fused polycyclic aromatic hydrocarbon are non-conjugated, and the second fused polycyclic aromatic hydrocarbon and the third fused polycyclic aromatic hydrocarbon are non-conjugated.

14. The rectifier according to claim 11, wherein the first linker and the second linker include a group selected from a thioether group, a dialkyl silyl ether group, an ether group, a phosphonic acid ester group, an ester group, and an azo group.

15. The rectifier according to claim 11, wherein the first conductive layer and the second conductive layer are made of same metal material.

16. The rectifier according to claim 11, wherein the organic molecular layer has a film thickness of 10 nm or smaller.

17. The rectifier according to claim 11, wherein the organic molecular layer contains organic molecules of structure (1).

18. The rectifier according to claim 11, wherein the organic molecular layer contains organic molecules of structure (2).

19. The rectifier according to claim 11, wherein the organic molecular layer contains organic molecules of structure (3).

20. The rectifier according to claim 11, wherein the organic molecular layer contains organic molecules of structure (4).

* * * * *